(12) United States Patent
Yonezawa et al.

(10) Patent No.: US 7,375,328 B2
(45) Date of Patent: May 20, 2008

(54) CHARGED PARTICLE BEAM APPARATUS AND CONTAMINATION REMOVAL METHOD THEREFOR

(75) Inventors: Akira Yonezawa, Tokyo (JP); Tatenori Jinriki, Tokyo (JP); Jun Nitta, Tokyo (JP); Norimichi Anazawa, Tokyo (JP); Ryuichi Shimizu, Osaka (JP)

(73) Assignee: Holon Co., Ltd., Tokyo (JP)

( * ) Notice: Subject to any disclaimer, the term of this patent is extended or adjusted under 35 U.S.C. 154(b) by 248 days.

(21) Appl. No.: 11/293,148

(22) Filed: Dec. 5, 2005

(65) Prior Publication Data

US 2006/0138363 A1 Jun. 29, 2006

(30) Foreign Application Priority Data

Dec. 10, 2004 (JP) .............................. 2004-358331

(51) Int. Cl.
*G01N 23/00* (2006.01)
*G21K 7/00* (2006.01)
(52) U.S. Cl. ...................... 250/310; 250/311; 250/307; 250/492.2
(58) Field of Classification Search ................ 250/310, 250/311, 307, 492.2
See application file for complete search history.

(56) References Cited

OTHER PUBLICATIONS

Suzuki et al. JP 2001242107 A, Published Sep. 7, 2001, Machine translated version.*
Honda et al. JP 2001236914 A, Published Aug. 31, 2001, Machine translated version.*

* cited by examiner

*Primary Examiner*—Jack I. Berman
*Assistant Examiner*—Meenakshi S Sahu
(74) *Attorney, Agent, or Firm*—Staas & Halsey LLP

(57) ABSTRACT

A charged particle beam apparatus comprising a preparatory evacuation chamber (15 in FIG. 1A) into which a sample (12) is conveyed and which is preliminarily evacuated, an ultraviolet irradiation unit (21) which is disposed in the preparatory evacuation chamber (15) and which irradiates the surface of the sample (12) conveyed into the preparatory evacuation chamber (15), with ultraviolet rays for a predetermined time period, and a sample chamber (16) into which the sample (12) is conveyed in the preliminarily evacuated state of the preparatory evacuation chamber (15) or from which the sample (12) is conveyed into the preparatory evacuation chamber (15), wherein the ultraviolet irradiation of the sample (12) by the ultraviolet irradiation unit (21) is performed before the conveyance of the sample (12) into the sample chamber (16), or/and after the conveyance thereof from the sample chamber (16), thereby to remove contamination on the surface of the sample (12).

14 Claims, 6 Drawing Sheets

CHARGED PARTICLE BEAM APPARATUS AND CONTAMINATION REMOVAL METHOD THEREFOR

BACKGROUND OF THE INVENTION

1. Field of the Invention

The present invention relates to a charged particle beam apparatus for observing and inspecting the surface of a sample, such as semiconductor wafer or photomask, which is liable to be contaminated by irradiation with a charged particle beam and to have the image observation spoilt, and a contamination removal method therefor.

2. Description of the Related Art

Heretofore, in an electron beam apparatus such as scanning electron microscope (SEM), it has been well known that image observation is hampered by the contamination of a sample attendant upon irradiation with an electron beam (refer to Non-patent Document 1). The contamination is said to be ascribable to the fact that the electron beam will impinge against hydrocarbons floating or adsorbed in the surface of the sample, to turn the hydrocarbons into carbon and to deposit the carbon on the sample. It is considered that much of the hydrocarbons will, not only be produced by gases emitted from the inside components of the apparatus, but also be brought into the SEM by the sample having already been contaminated. It is therefore often observed that the production rate of the contamination becomes much higher than usual.

As countermeasures against the contamination in the electron beam apparatus, there are the following examples:

(1) Low-temperature Contamination Prevention Apparatus: A metal plate held at a low temperature (for example, liquid nitrogen temperature) is disposed around a sample which is irradiated with an electron beam, so as to adsorb hydrocarbons into the metal plate and to diminish the contamination of the sample.

(2) Purification and Degassing of Components: Components inside a sample chamber are subjected to ultrasonic cleaning with a solvent and are further degassed at high temperatures, and they are thereafter assembled into an electron beam apparatus, whereby hydrocarbons to be emitted are decreased, and the contamination of a sample is diminished.

Even after the above countermeasures (1) and (2), the diminution of the contamination of the sample is sometimes unsatisfactory. Especially in the observation of the surface of a semiconductor wafer or photomask or a pattern length measurement on the surface, an identical place is measured a plurality of times. On this occasion, a pattern size is often changed by the contamination attendant upon the electron beam irradiation, and even when the magnitude of the change is slight, unallowable lowering in the reproduction precision of length measurement values is sometimes incurred.

(3) Down-flow type Asher: Active oxygen is produced by radio-frequency discharge from a mixture gas consisting of $O_2$ and $CF_4$ and is reacted with hydrocarbons, thereby to remove contamination (refer to Non-patent Document 2). With this technique, an optimization control is difficult, and rather the lowering of the reproduction precision of length measurement values attributed to etching will be incurred in the observation of the surface of a semiconductor wafer or photomask or a pattern length measurement on the surface.

As stated above, it cannot be said that the related-art countermeasures against the contamination in the electron beam irradiation apparatus are satisfactory.

Meanwhile, in semiconductor manufacture, a dry cleaning method wherein organic substances on the surface of an Si substrate are removed by irradiation with ultraviolet rays has been well known. The principles of this method are as stated below. Oxygen $O_2$ is dissociated into active oxygen O by the ultraviolet rays. Owing to the active oxygen, the organic substances undergo oxidation decompositions, thereby to be volatilized and removed. In particular, it has been known that a method of cleaning the Si substrate by irradiation with ultraviolet rays (vacuum ultraviolet rays at a wavelength of 172 nm) from an excimer lamp is effective (refer to Non-patent Document 3). This document indicates that, in the atmospheric air, when the density of the active oxygen at the sample surface is heightened by setting several mm or less as the distance between the sample and the window plane of the excimer lamp, a cleaning effect increases, whereas when the distance is made longer, the cleaning effect decreases because an ultraviolet dose to fall on the sample surface lessens due to the absorption of the ultraviolet rays by the atmospheric air, so the quantity of the active oxygen to appear in the vicinity of the surface lessens.

It is to be noted, however, that the ultraviolet irradiation has never been employed for the removal or prevention of the contamination in the charged particle beam apparatus.

[Non-patent Document 1] Electron Microscope (1981), Vol. 16, No. 1, p. 2, published by the Japanese Society of Microscopy

[Non-patent Document 2] Materials of the 117th Study Meeting (1991), p. 137, 132nd Committee, published by Japan Society for the Promotion of Science

[Non-patent Document 3] Paper Issue (1999), Vol. 83, No. 5, published by the Illuminating Engineering Institute of Japan

SUMMARY OF THE INVENTION

An object of the present invention is to provide a charged particle beam apparatus such as length measurement apparatus and a contamination removal method therefor, in which a sample is irradiated with ultraviolet rays under the atmospheric pressure or a reduced pressure or in the gaseous atmosphere of oxygen or the like, so as to prevent, remove or diminish the contamination of the sample attributed to the irradiation of this sample with a charged particle beam, whereby the length measurement reproducibility of the pattern of a semiconductor wafer or a photomask, and so forth are enhanced without incurring the lowering of an operability or a throughput in the length measurement apparatus or the like.

In order to accomplish the object, according to the invention, in a charged particle beam apparatus wherein an image is generated by irradiating a sample with a charged particle beam and detecting secondary electrons or the likes emitted from the sample, the sample is irradiated with ultraviolet rays for a predetermined time period before or after the automatic conveyance of the sample into a sample chamber, within a chamber the interior of which is held in the atmospheric air or at a reduced pressure, within a gas introduction chamber into which a gas such as oxygen is introduced, or within the sample chamber the interior of which is held at a reduced pressure or into which a gas such as oxygen is introduced, thereby to attain the prevention, removal or diminution of the contamination of the sample.

Thus, in the charged particle beam apparatus, the contamination of the sample is removed or diminished without etching, before or after the observation of the sample based on the charged particle beam, whereby the reproduction precision of the length measurement of a pattern, and so forth can be enhanced, and an operability or a throughput can be enhanced in interlocking with the automatic conveyance of the sample.

DESCRIPTION OF THE PREFERRED EMBODIMENTS

By way of example, an excimer lamp was applied to a length measurement SEM for photomasks. When the photomask contaminated by SEM observation was irradiated with ultraviolet rays based on the excimer lamp, the contamination was diminished or prevented, and the reproduction precision of length measurements was enhanced. Now, the present invention will be successively described in detail by taking an electron beam as an example of a charged particle beam.

Figure 1A:
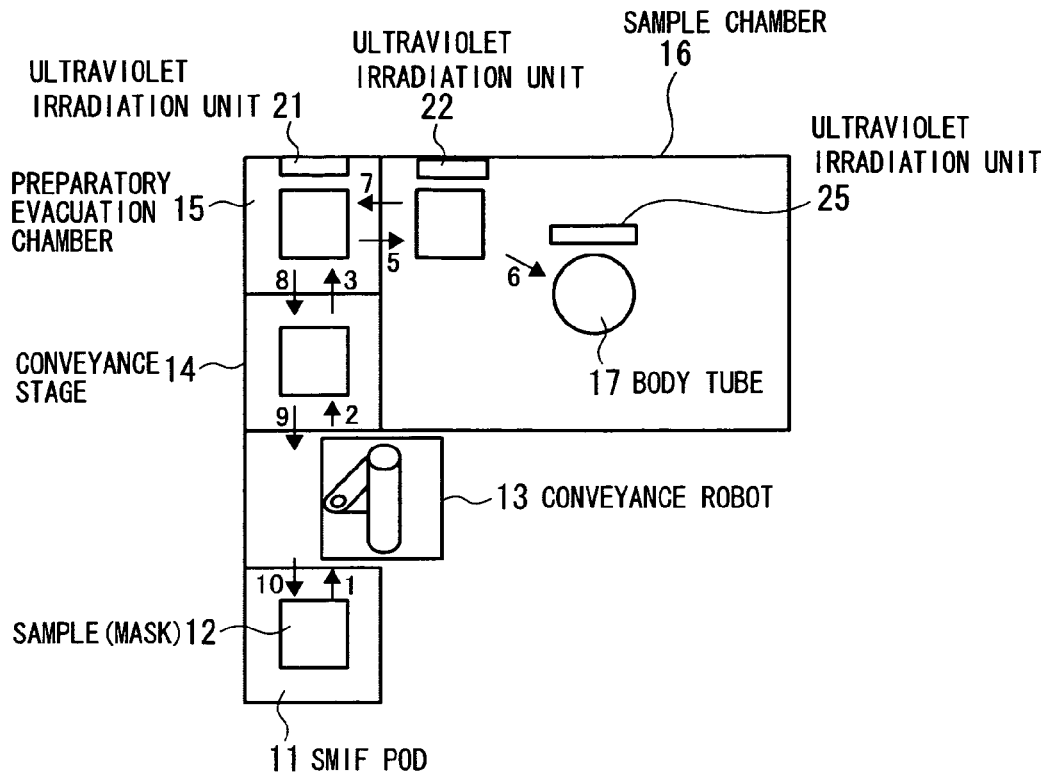
FIGS. 1A and 1B are configurational views of embodiments of the present invention, respectively.
Figure 1B:
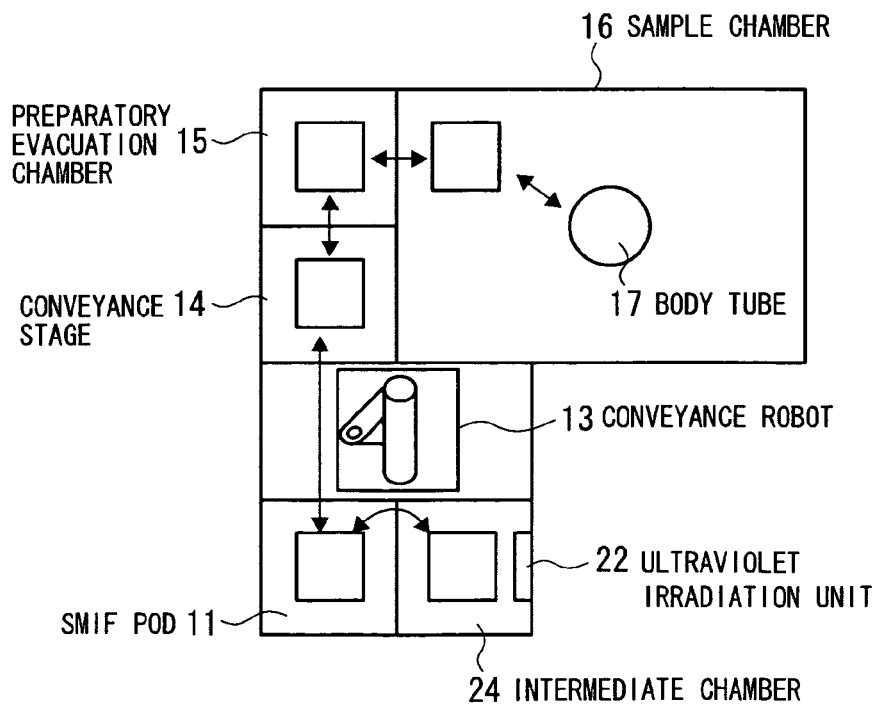

FIGS. 1A and 1B show the configurational views of embodiments of the invention, respectively. The illustrated configurational views are the partial plan views of a length measurement SEM for photomasks.

In the embodiment shown in FIG. 1A, a sample (mask) 12 is irradiated with ultraviolet rays in a preparatory evacuation chamber 15 or/and a sample chamber 16 for a predetermined time period, thereby to remove the contamination of the sample 12.

Referring to FIG. 1A, a SMIF (Standard Mechanical Interface) pod 11 is a box for accommodating and conveying a plurality of samples 12, here, masks (photomasks) in a clean state (a state where no dust is adherent).

The sample (mask) 12 is a sample (mask) to-be-handled whose surface is irradiated with the ultraviolet rays for the predetermined time period so as to remove the contamination (the expression "removal" shall include both the removal of the contamination ascribable to electron beam irradiation or the like and the removal of hydrocarbons originating the contamination, and the same shall hold true hereinbelow).

A conveyance robot 13 is a robot which opens the door of the SMIF pod 11, fetches a predetermined one of the samples (masks) 12 and conveys the fetched sample to a conveyance stage 14 here in this case, and which conversely conveys the sample 12 put on the conveyance stage 14, to the SMIF pod 11 and shuts the door.

The conveyance stage 14 is a stage (a fixation bed or fixation case for conveying the sample 12) to which the sample (mask) 12 is fixed and which conveys this sample into the preparatory evacuation chamber 15 or the sample chamber 16 at a succeeding step, and in the reverse direction.

The preparatory evacuation chamber 15 is a chamber which preparatorily evacuates air from the atmospheric air or leaks air into a vacuum up to the atmospheric air in order to convey the sample 12 into or out of the sample chamber 16 of high vacuum. Here in the preparatory evacuation chamber 15, an ultraviolet irradiation unit 21 is disposed so as to automatically irradiate the sample 12 with ultraviolet rays for a predetermined time period during the conveyance of this sample and to thus remove the contamination.

The ultraviolet irradiation unit 21 which is disposed in the preparatory evacuation chamber 15 subjects the sample 12 conveyed into the preparatory evacuation chamber 15, to the ultraviolet irradiation for the predetermined time period, thereby to remove the contamination. Incidentally, although the ultraviolet irradiation unit 21 is shown by the side of the mask 12 within the preparatory evacuation chamber 15 in FIG. 1A, it is actually arranged over the mask 12 (anyway, the ultraviolet irradiation unit 21 may be capable of irradiating the whole surface of the mask 12).

The sample chamber 16 is a chamber in which the sample (mask) 12 is scanned (as linear scan or planar scan) while being irradiated with the finely focused electron beam, so as to detect secondary electrons emitted from the sample 12 and to display an image. Here, the sample chamber 16 includes a body tube 17, an ultraviolet irradiation unit 22, etc.

The body tube 17 focuses the electron beam finely so as to irradiate the surface of the sample 12 with the focused electron beam. In this state, the sample surface is scanned (as linear scan or planar scan), and the image is generated (refer to FIG. 3).

The ultraviolet irradiation unit 22 which is disposed in the sample chamber 16 irradiates the sample 12 conveyed into the sample chamber 16, with ultraviolet rays for a predetermined time period, thereby to remove the contamination. Incidentally, although the ultraviolet irradiation unit 22 is shown by the side of the mask 12 within the sample chamber 16, it is actually arranged over the mask 12 (anyway, the ultraviolet irradiation unit 22 may be capable of irradiating the whole surface of the mask 12). Besides, the ultraviolet irradiation unit 22 may be mounted at any position of the upper plate of the sample chamber 16 as viewed in FIG. 1A. It is also allowed that an ultraviolet irradiation unit 25 which is disposed by the side of the body tube 17 is constructed of a compact deuterium lamp, so as to project ultraviolet rays onto the vicinity of an electron beam irradiation point on the surface of the mask 12.

Owing to the above configuration, the surface of the sample 12 is irradiated with the ultraviolet rays for the predetermined time period by the ultraviolet irradiation unit 21, 22 or 25 within at least one of the preparatory evacuation chamber 15 and the sample chamber 16, whereby the contamination of the surface of the sample 12 can be removed by active oxygen or the like produced.

In the embodiment shown in FIG. 1B, a sample 12 is irradiated with ultraviolet rays in an intermediate chamber 24 for a predetermined time period, thereby to remove the contamination of the sample 12. Since a SMIF pod 11, the sample (mask) 12, a conveyance stage 14, a preparatory evacuation chamber 15', a sample chamber 16 and a body tube 17 are respectively identical to the constituents of the same reference numerals in FIG. 1A, they shall be omitted from description.

Referring to FIG. 1B, a conveyance robot 13 is a robot which opens the door of the SMIF pod 11, fetches a predetermined one of the samples (masks) 12 and conveys the fetched sample to the conveyance stage 14 or the intermediate chamber 24 here in this case, which conveys the sample 12 between the intermediate chamber 24 and the conveyance stage 14, and which conveys the sample 12 put on the conveyance stage 14 or in the intermediate chamber 24, to the SMIF pod 11 and shuts the door.

The intermediate chamber 24 is a chamber in which the sample 12 is put, so as to irradiate this sample with ultraviolet rays for a predetermined time period by an ultraviolet irradiation unit 23. Here, the intermediate chamber 24 includes the ultraviolet irradiation unit 23, etc.

The ultraviolet irradiation unit 23 which is disposed in the intermediate chamber 24 subjects the sample 12 conveyed into the intermediate chamber 24, to the ultraviolet irradiation for the predetermined time period, thereby to remove the contamination.

Owing to the above configuration, the surface of the sample 12 is irradiated with the ultraviolet rays for the predetermined time period by the ultraviolet irradiation unit 23 within the intermediate chamber 24, whereby the contamination of the surface of the sample 12 can be removed by active oxygen or the like produced.

Figure 2:
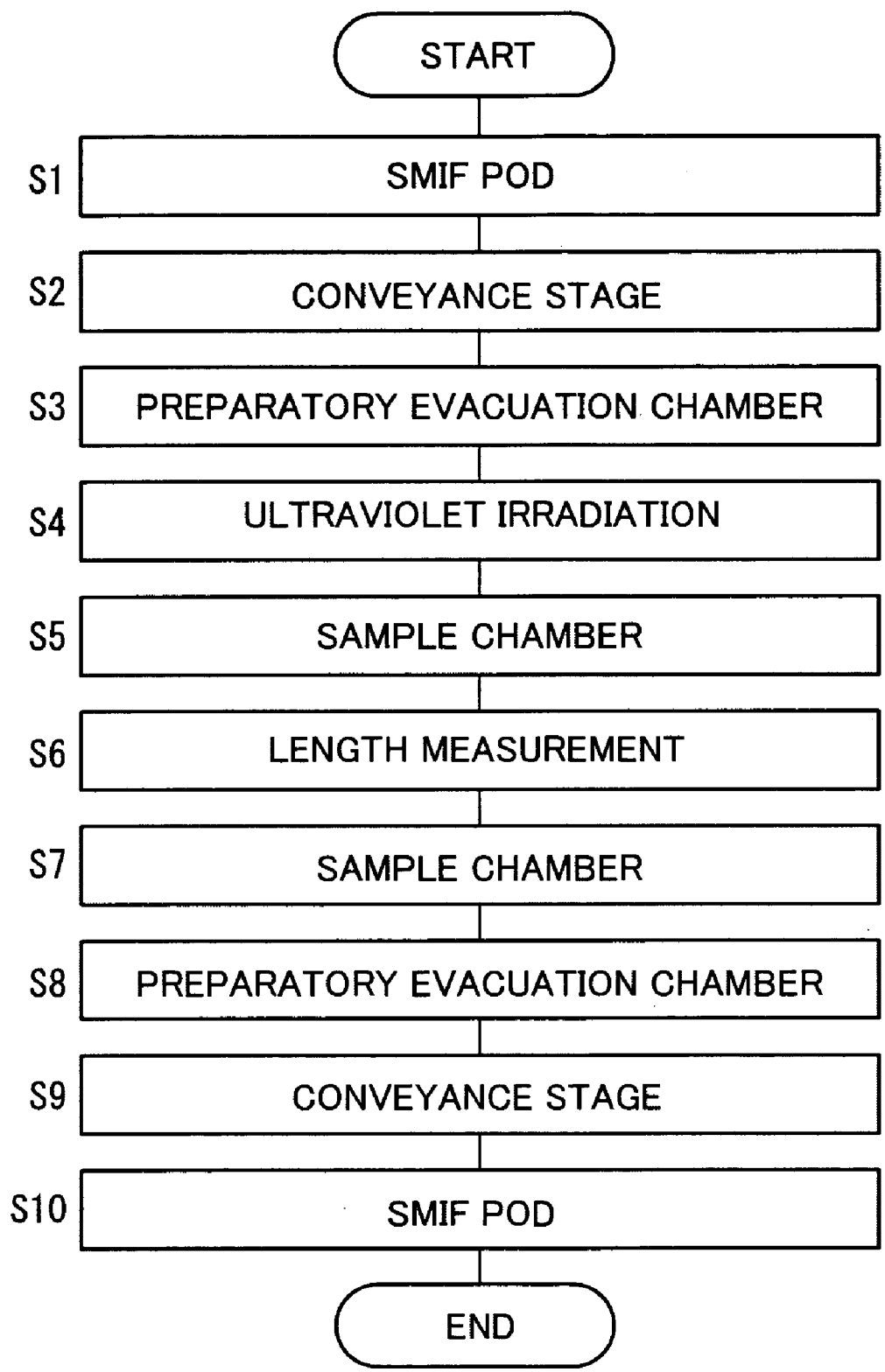
FIG. 2 is a flow chart for explaining the operation of the invention (in correspondence with FIG. 1A)

FIG. 2 shows a flow chart for explaining the operation of the invention (in correspondence with FIG. 1A). Steps S1 through S10 in FIG. 2 correspond to reference numerals 1 through 10 indicated in FIG. 1A, respectively.

Referring to FIG. 2, the step S1 brings the sample 12 out of the SMIF pod 11.

The step S2 puts the sample 12 on the conveyance stage 14. At the steps S1 and S2, the conveyance robot 13 in FIG. 1A turns the SMIF pod 11 into the open state, it fetches and conveys the predetermined sample (mask) 12, and it puts the fetched sample on the conveyance stage 14.

The step S3 puts the sample 12 in the preparatory evacuation chamber 15. At this step, the sample 12 put on the conveyance stage 14 at the step S2 is automatically conveyed into the preparatory evacuation chamber 15 by a conveyance mechanism not shown, together with this conveyance stage 14.

The step S4 irradiates the sample 12 with the ultraviolet rays. At this step, the whole surface of the sample 12 put in the preparatory evacuation chamber 15 at the step S3 (the sample 12 put on the conveyance stage 14) is irradiated with the ultraviolet rays for the predetermined time period by the ultraviolet irradiation unit 21 disposed in this preparatory evacuation chamber 15, thereby to remove the contamination.

The step S5 puts the sample 12 in the sample chamber 16. At this step, the sample 12 subjected to the ultraviolet irradiation and contamination removal at the step S4 (the sample 12 put on the conveyance stage 14) is put in the sample chamber 16, and it is moved to the predetermined position of the body tube 17 (a position for measuring the length and photographing the image).

The step S6 measures the length. At this step, the dimension of a designated pattern is measured as to the sample 12 set at the predetermined position of the body tube 17 at the step S5 (as will be described with reference to FIG. 5A or 5B).

The step S7 puts the sample 12 out of the sample chamber 16.

The step S8 puts the sample 12 out of the preparatory evacuation chamber 15.

The step S9 puts the sample 12 out of the conveyance stage 14.

The step S10 puts the sample 12 in the SMIF pod 11. At the steps S7, S8, S9 and S10, the sample 12 is conveyed from the sample chamber 16 into the SMIF pod 11 in a procedure reverse to that of the conveyance of this sample from the SMIF pod 11 into the sample chamber 16.

Here, regarding the sample (mask) 12 put on the conveyance stage 14 within the preparatory evacuation chamber 15, the excimer lamp which emits the ultraviolet rays at the wavelength of 172 nm is disposed at the upper part of this preparatory evacuation chamber 15. The surroundings of the excimer lamp are held in a nitrogen atmosphere in order to prevent the ultraviolet rays from being absorbed by oxygen in the atmospheric air, and the excimer lamp is constructed so as to irradiate the mask (sample) 12 with the ultraviolet rays through its quartz window (refer to FIG. 4A). The preparatory evacuation chamber 15 is preliminarily evacuated by a low-vacuum pump such as dry pump, and the ultraviolet rays are projected onto the whole surface of the mask (sample) 12 (steps S3 and S4). Since the ultraviolet rays are projected during the preliminary evacuation, the contamination ascribable to the hydrocarbons, etc. can be removed without spoiling a throughput. The active oxygen is produced in the vicinity of the surface of the mask (sample) 12 by the ultraviolet rays, and organic substances on the surface of the mask (sample) 12 are turned into $CO_2$ and $H_2O$, which are volatilized and drawn off, so that the mask (sample) 12 is cleaned. In an example, a cleaning effect increased when the preparatory evacuation chamber 15 was evacuated to a pressure which was about 0.1 Torr lower than the atmospheric pressure. In this regard, since the distance between the surface of the mask (sample) 12 and the quartz window was about 1 cm, the ultraviolet rays were absorbed much in the atmospheric air, so that the active oxygen in the vicinity of the surface of the mask (sample) 12 decreased conspicuously. In contrast, owing to the reduced pressure of the interior of the preparatory evacuation chamber 15, the absorption of the ultraviolet rays will have decreased to effectively produce the active oxygen in the vicinity of the surface of the mask (sample) 12. Further, in order to increase the cleaning effect, oxygen $O_2$, ozone $O_3$ or the like gas in a suitable quantity may well be introduced into the preparatory evacuation chamber 15 in the reduced pressure state. After the cleaning and preliminary evacuation, the preparatory evacuation chamber 15 is regularly evacuated by a high-vacuum pump such as turbo molecular pump (oilless vacuum pump).

Figure 5A:
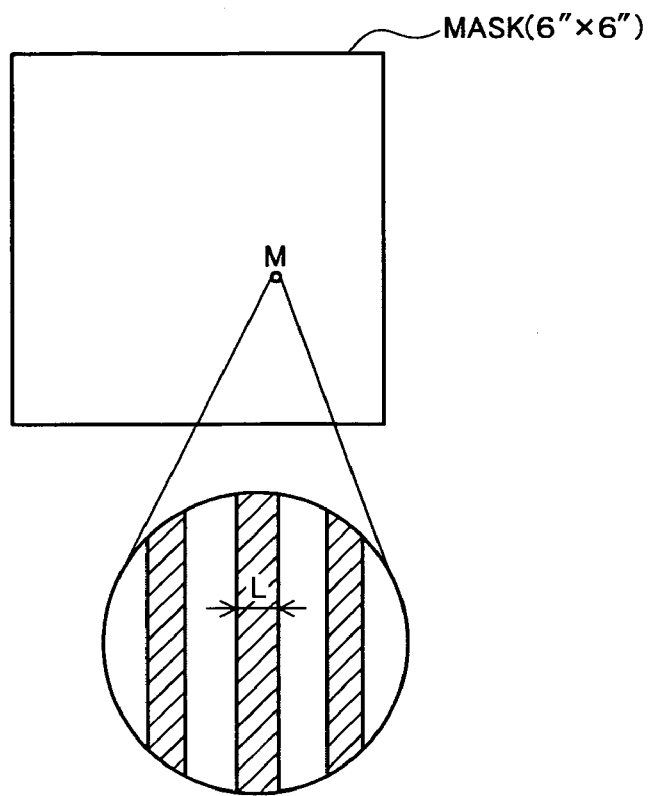
FIGS. 5A and 5B are diagrams for explaining the invention (length measurement), respectively.

Besides, a valve located between the preparatory evacuation chamber 15 and the sample chamber 16 is opened, and the mask (sample) 12 is conveyed to a sample stage not shown, disposed within the sample chamber 16 (step S5). As shown in FIG. 5A, the vicinity of a preset measurement point M on the surface of the mask (sample) 12 is moved directly under the body tube 17, and the line width L of a line, for example, has its image observed and is measured. The set place is repeatedly measured a plurality of times (step S6). After the image observation and the length measurement are ended, the mask (sample) 12 is put out of the sample chamber 16 into the preparatory evacuation chamber 15 (step S7). After the vacuum leakage of the preparatory evacuation chamber 15, the mask (sample) 12 is put out of the preparatory evacuation chamber 15 (step S8). Thereafter, the mask (sample) 12 is returned into the SMIF pod 12 (steps S9 and S10). Then, the series of operations for the image observation and length measurement are ended.

In the embodiment of FIG. 2, the contamination is removed by irradiating the whole surface of the mask (sample) 12 with the ultraviolet rays before the length measurement, that is, before the electron beam irradiation. The reason therefor is as stated below. It is considered that the contamination ascribable to the hydrocarbons, etc. will have already adhered onto the surface of the photomask being the mask (sample) 12, at any step other than the SEM observation as precedes the process of FIG. 2, and that it will be brought into the apparatus shown in FIG. 1A. Therefore, the contamination should be removed from the whole region of the surface of the mask (sample) 12 before the electron beam irradiation. Of course, even in a case where the surface of the mask (sample) 12 has suffered from the contamination attendant upon the electron beam irradiation, on account of the SEM observation and length measurement at the preceding step, the embodiment of FIG. 2 brings forth the remarkable advantage that, owing to the ultraviolet irradiation, the contamination ascribable to the electron beam irradiation and also adherent substances such as hydrocarbons originating the contamination can be turned into the volatile gases (for example, $CO_2$ and $H_2O$) by the active oxygen, thereby to be removed (evacuated and removed).

Figure 6A:
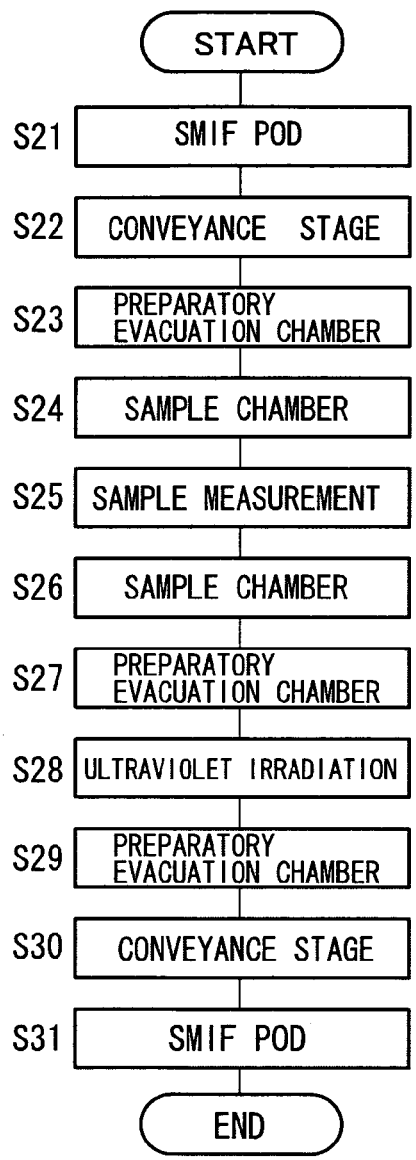
FIGS. 6A and 6B are flow charts for explaining the other operations of the invention, respectively.

Besides, in a case where the mask (sample) 12 has not been contaminated by the electron beam irradiation and where the hydrocarbons or the likes are not adherent on the surface of this mask (sample) 12, the ultraviolet irradiation before the length measurement may well be omitted so as to perform only ultraviolet irradiation after the length measurement (unlike in FIG. 2, the ultraviolet irradiation is not performed before the length measurement, but it is performed after the length measurement, and this aspect will be described later with reference to FIG. 6A). In this case, the whole area of the surface of the mask (sample) 12 is irradiated with the ultraviolet rays during the vacuum leakage of the preparatory evacuation chamber 15, whereby the contamination attendant upon the image observation and length measurement is removed or diminished without spoiling a throughput.

Figure 5B:
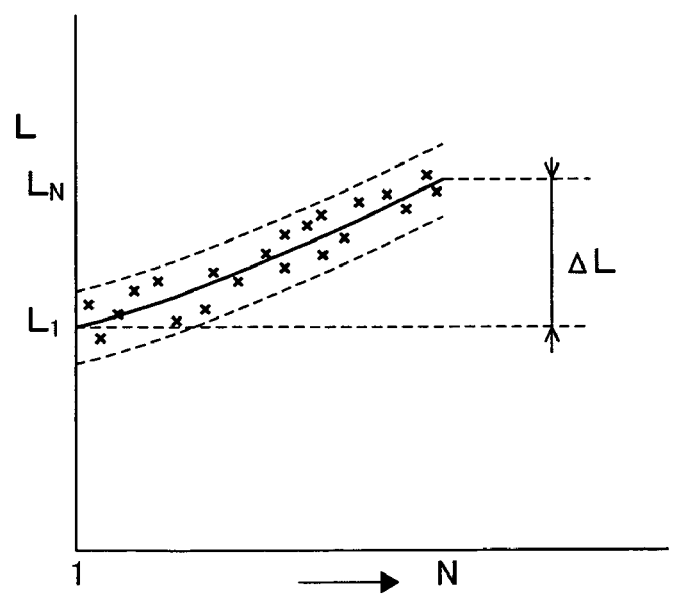
Figure 6B:
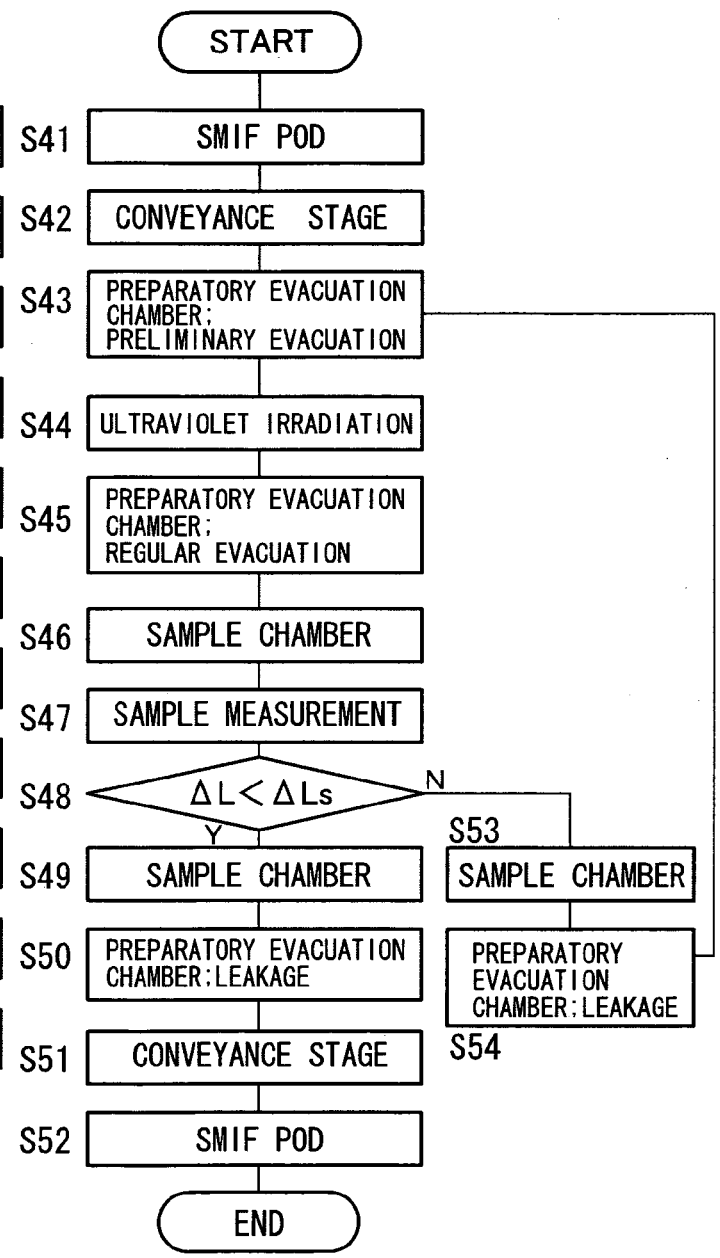

Besides, in a case where, in the process of FIG. 2, the contamination has not been satisfactorily removed by the ultraviolet irradiation of the mask (sample) 12, the average of length measurement values L sometimes increases gradually after the N times of length measuring operations (refer to FIG. 5B). In a case where an increment $\Delta L$ (=LN–L1) after the length measurement exceeds a preset reference value $\Delta Ls$, a process as shown in FIG. 6B is performed in which the mask (sample) 12 is conveyed out from the sample chamber 16 into the preparatory evacuation chamber 15, it is subjected to ultraviolet irradiation and cleaning again after vacuum leakage, and it is thereafter conveyed into the sample chamber 16 and subjected to a length measurement again, whereby a length measurement reproducibility can be enhanced. Moreover, since the series of processing operations shown in FIG. 2 or in FIG. 6A or 6B are automatically performed by a preset recipe, an operability is not spoilt.

It is also possible that the vacuum pressure value of the preparatory evacuation chamber 15 during the ultraviolet irradiation is controlled so as to enhance the cleaning effect based on the ultraviolet irradiation. By way of example, oxygen is conducted from a nozzle onto the surface of the mask (sample) 12 for a predetermined time period so that the measurement value of a vacuum gauge may be held at 1 Torr. Further, optimum values may well be set in such a way that the irradiation time period of the ultraviolet rays and the number of times of the ultraviolet irradiations are experimentally found beforehand in accordance with the number of times of length measuring operations, a beam current and the like irradiation conditions for irradiating the mask (sample) 12 with the electron beam, the sort of the mask (sample) 12, and so forth.

Figure 3:
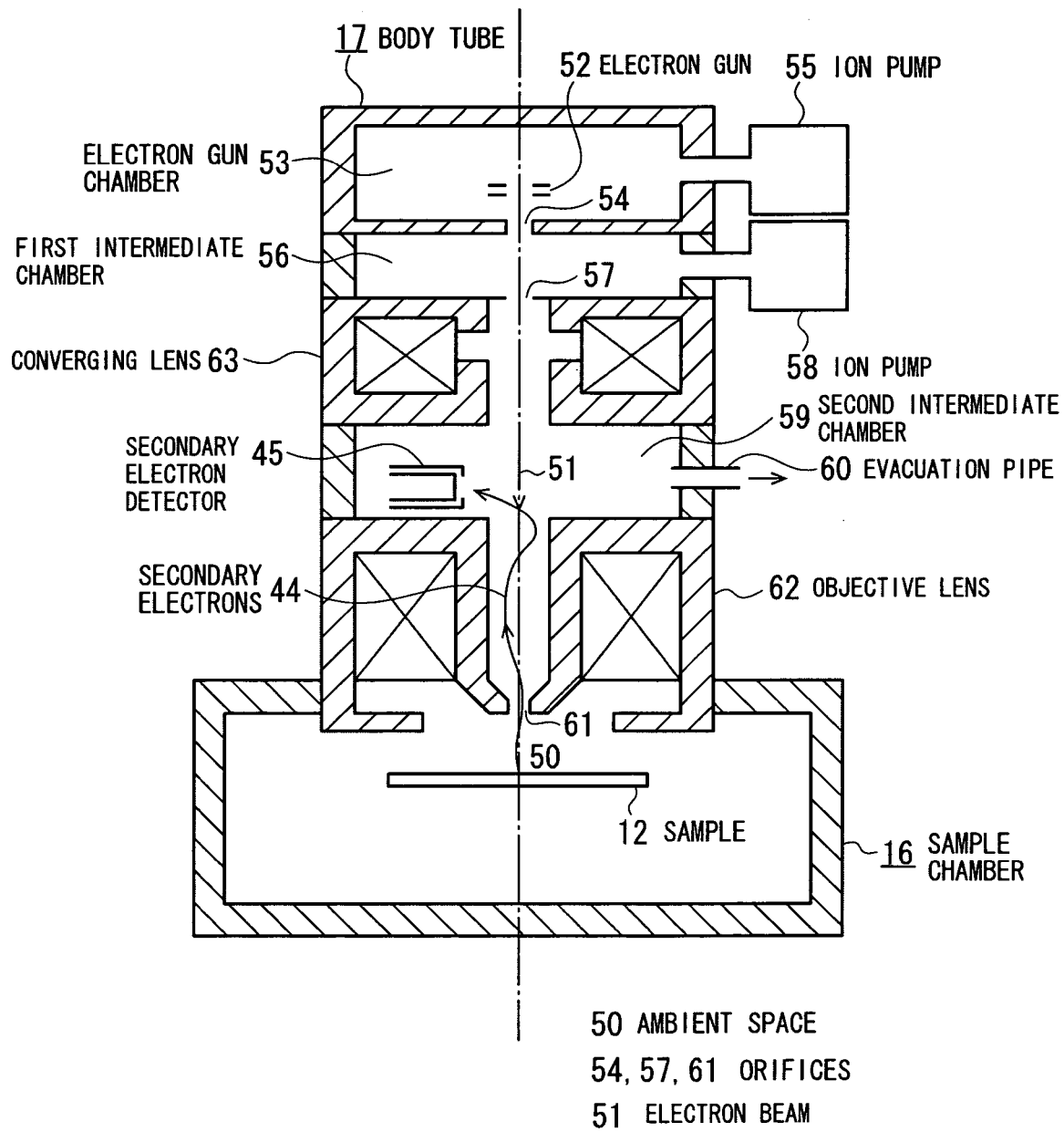
FIG. 3 is a view for explaining the invention (a body tube and a sample chamber)

FIG. 3 shows a view for explaining the invention. This figure shows a configurational example of the body tube 17 as well as the sample chamber 16 in FIG. 1A or 1B.

Referring to FIG. 3, an electron beam 51 is formed in such a way that electron rays are emitted from an electron gun 52 and are converged by a converging lens 63, and that the converged electron rays are fined by an objective lens 62 so as to be focused on the surface of the sample 12. Here, the sample 12 is scanned with the electron beam 51 by a deflection system not shown (scanned in either an X-direction or a Y-direction as a linear scan, or scanned in both the X-direction and the Y-direction as a planar scan). Besides, secondary electrons 44 emitted by scanning the sample 12 with the electron beam 51 are detected by a secondary electron detector 45 so as to display a so-called "line profile image" or secondary electron image on a display device not shown.

The converging lens 63 converges the electron rays emitted from the electron gun 52.

The objective lens 62 projects the electron beam 51 onto the sample 12 in the finely focused state. The finely focused electron beam 51 is deflected as a linear scan or a planar scan by the deflection system not shown.

The sample 12 is a sample to be observed or to have a length measured, and it is, for example, a wafer or a photomask.

The electron gun 52 is an electron gun of, for example, field emission type, and electrons are extracted, accelerated and emitted by applying a high electric field to a tip cathode at the distal end of this electron gun.

An electron gun chamber 53 is a chamber in which the electron gun 52 is accommodated, and which is evacuated to a high vacuum by an ion pump 55.

An orifice 54 is a small aperture, through which the electron beam 51 emitted from the electron gun 52 is passed, and which serves to hold the pressure difference (for example, $10^{-2}$ to $10^{-3}$ Torr) between the electron gun chamber 53 and a first intermediate chamber 56.

The first intermediate chamber 56 is a chamber which is disposed between the electron gun chamber 53 and a second intermediate chamber 59, and which is evacuated to a vacuum by an ion pump 58. This first intermediate chamber 56 serves to hold the vacuum pressure of the electron gun chamber 53 low in cooperation with an orifice 57 which is a small aperture provided below.

The second intermediate chamber 59 is a chamber which is provided over the objective lens 62, and in which the secondary electron detector 45 is disposed here in this case.

An evacuation pipe 60 is connected to an unshown evacuation system (such as turbo molecular pump) which evacuates the second intermediate chamber 59 into a vacuum.

The secondary electron detector 45 detects the secondary electrons 44 at a high efficiency in such a way that a positive high electric field is applied to the secondary electrons 44 emitted during the irradiation of the sample 12 with the electron beam 51, so as to move these electrons upwards while swirling them in the vicinity of the center axis of the objective lens 62 (swirling them by the electric field of the objective lens 62).

The sample chamber 16 is a chamber which accommodates the sample 12, etc. therein and hold them in a vacuum.

An ambient space 50 is a space around that region of the sample 12 which is linearly scanned or planarly scanned with the electron beam 51. In the ambient space 50, the surface of the sample 12 is irradiated with the ultraviolet rays by the ultraviolet irradiation unit 22 (shown in FIG.

1A), thereby to remove or diminish the contamination on the sample 12. On this occasion, although no illustration is made, oxygen (or air) is injected from a nozzle onto the surface of the sample 12, and the active oxygen is produced by the ultraviolet irradiation so as to turn the contamination of the surface of the sample 12 into the volatile gases (for example, $CO_2$ and $H_2O$), whereby the contamination is removed or diminished.

When the sample chamber 16 has its internal pressure raised by introducing a gas thereinto, an orifice 61 serves to suppress the flow of the gas into the second intermediate chamber 59 as far as possible (usually, it serves to hold the pressure difference between the sample chamber 16 and the second intermediate chamber 59 (for example, $10^{-2}$ to $10^{-3}$ Torr).

The body tube 17 having the above configuration is used as the body tube 17 of the identical reference numeral in FIG. 1A or 1B.

Figure 4A:
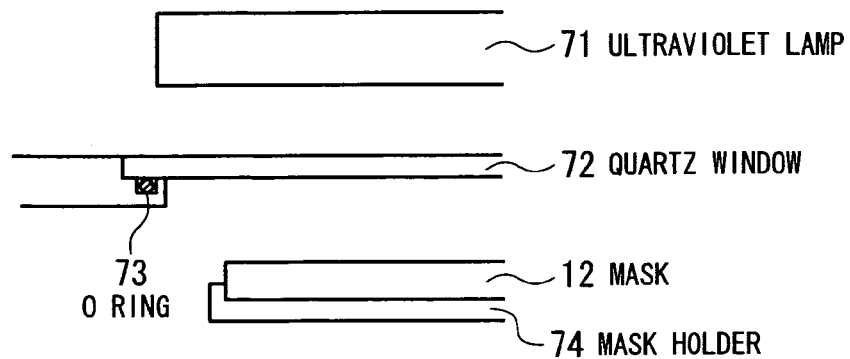
FIGS. 4A and 4B are views showing examples of ultraviolet irradiation units in the invention, respectively.
Figure 4B:
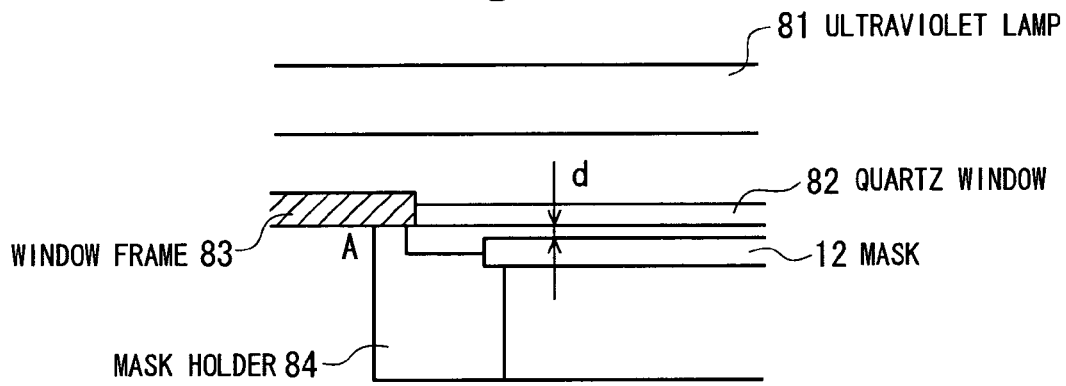

FIGS. 4A and 4B show examples of the ultraviolet irradiation units in the invention (as side views), respectively.

FIG. 4A exemplifies the ultraviolet irradiation unit 21 which is disposed in the preparatory evacuation chamber 15.

Referring to FIG. 4A, an ultraviolet lamp 71 is a lamp which emits ultraviolet rays, and which is, for example, an excimer lamp.

A quartz window 72 is a window through which the ultraviolet rays emitted from the ultraviolet lamp 71 disposed in the atmospheric air are introduced into the vacuum without loss, and which is made of quartz and induces little loss (transmission loss) for the ultraviolet rays.

An O-ring 72 is an O-ring for vacuum sealing as seals the vacuum side of the mask 12 from the nitrogen atmosphere side of the ultraviolet lamp 71.

The mask 12 is an example of the sample 12.

A mask holder 74 is a holder which holds the mask 12.

The ultraviolet irradiation unit 21 of the above configuration is disposed in the preparatory evacuation chamber 15 in FIG. 1A already referred to. Besides, the ultraviolet lamp 71 is lit up, and the generated ultraviolet rays are transmitted through the quartz window 72 and irradiate the whole surface of the mask (sample) 12 for the predetermined time period, automatically in accordance with the recipe during the preliminary evacuation of the preparatory evacuation chamber 15. Thus, it is permitted to remove or diminish the contamination as already described.

FIG. 4B exemplifies the ultraviolet irradiation unit 23 which is disposed in the intermediate chamber 24.

Referring to FIG. 4B, an ultraviolet lamp 81 is a lamp which emits ultraviolet rays, and which is, for example, an excimer lamp.

A quartz window 82 is a window through which the ultraviolet rays emitted from the ultraviolet lamp 81 disposed in a nitrogen atmosphere are introduced into the intermediate chamber 24 without loss, and which is made of quartz and induces little loss (transmission loss) for the ultraviolet rays.

A window frame 83 is interposed between the ultraviolet lamp 81 and the interspace of the intermediate chamber 24.

The mask 12 is an example of the sample 12.

A mask holder 84 is a holder which holds the mask 12.

The ultraviolet irradiation unit 23 having the above configuration is disposed in the intermediate chamber 24 in FIG. 1B already referred to. Besides, in the state where the mask 12 is put in the intermediate chamber 24, the ultraviolet lamp 81 is lit up, and the generated ultraviolet rays are transmitted through the quartz window 82 and irradiate the whole surface of the mask (sample) 12 for the predetermined time period, automatically in accordance with the recipe. Thus, it is permitted to remove or diminish the contamination as already described. Here, in the case where the ultraviolet irradiation unit 23 is disposed in the intermediate chamber 24, the distance d between the surface of the mask (sample) 12 and the plane of the quartz window 82 as spaces the ultraviolet lamp 81 is set at a short distance of 1-2 mm in order to enhance a cleaning effect for this mask (sample), for example, a photomask disposed in the atmospheric air, by preventing the absorption of the ultraviolet rays attributed to oxygen in the atmospheric air. After having been set on the mask holder 84 within the intermediate chamber 24 by the conveyance robot 13 shown in FIG. 1B, the mask 12 is raised by an ascent/descent mechanism not shown, and the mask holder 84 is caused to abut on the window frame 83 at its part A, thereby to stipulate the distance d between the plane of the mask 12 and that of the quartz window 82 (FIG. 4B). After the distance d has been set, the whole area of the surface of the mask 12 is irradiated with the ultraviolet rays for, for example, 30 seconds. In order to increase the cleaning effect, a gas such as oxygen $O_2$ or ozone $O_3$ may well be introduced into the intermediate chamber 24. Here, although the function of an exhaust duct or the like for exhausting a gas, such as $CO_2$, produced by the reaction between the ozone or active oxygen and the hydrocarbons on the surface of the mask 12 is not illustrated, the mechanism thereof is disposed.

Figure 4C:
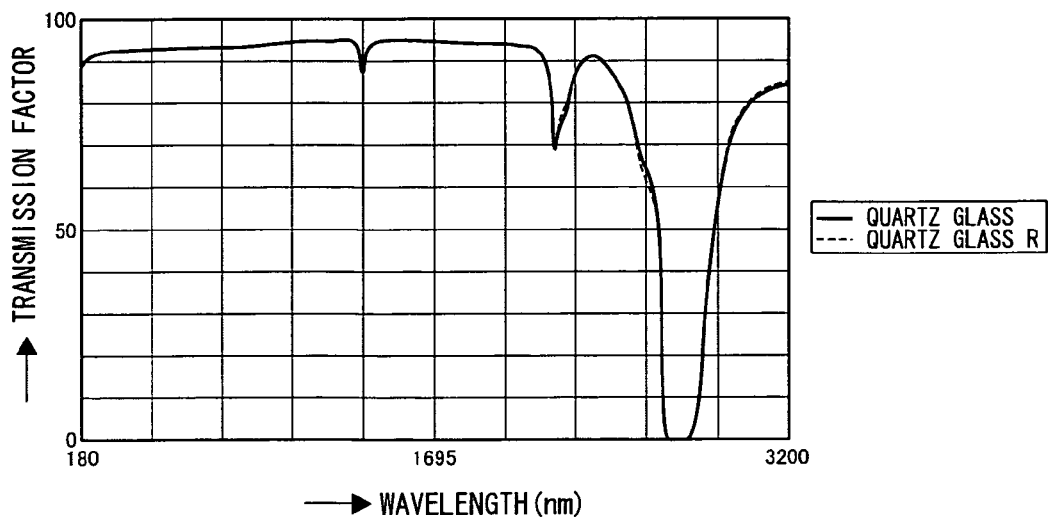
FIG. 4C is a diagram for explaining the transmission factor of a quartz window.

FIG. 4C shows examples of the transmission factor of the mask. More specifically, this figure exemplifies the variations of the transmission factor of transmitted light through the mask (sample) 12, versus the wavelength of the light. The curve of quartz glass as indicated by a solid line in the figure shows the transmission factor of a part which was subjected to the cleaning process based on the ultraviolet irradiation in the invention. On the other hand, the curve of quartz glass R as indicated by a broken line in the figure shows the transmission factor of a part which was not subjected to the cleaning process based on the ultraviolet irradiation. It is understood that both the curves overlap each other without a substantial difference, and that they are indistinguishable concerning exposure to, for example, an ArF excimer laser (at a wavelength of 193 nm). Thus, it has been revealed that, even when the contamination removal based on the ultraviolet irradiation is performed for the mask (sample) 12 made of the quartz glass, the transmission factor of this mask (sample) 12 does not change.

FIGS. 5A and 5B show diagrams for explaining the invention (length measurement), respectively.

FIG. 5A shows an example in which the line width or the like of a pattern on a mask (6"×6") is measured.

Referring to FIG. 5A, the mask 12 is in the shape of a plate of 6 inches×6 inches, and its surface is formed with microscopic patterns. Regarding the pattern which is designated for the length measurement on the mask 12, an enlarged pattern is shown at a lower part. The line width L designated on the pattern is measured. In the line measurement, the mask shown in FIG. 5A is fixed to the position of the sample 12 which underlies the body tube 17 constituting the SEM scanning side electron microscope as shown in FIG. 3 already referred to, this mask is planarly scanned with the spot of the finely focused electron beam 1 by moving the electron beam spot through and near the designated place M, the secondary electrons emitted on this occasion are detected by the secondary electron detector 45, and a brilliance is modulated with the detection signal of the secondary electron detector 24 in synchronism with the scan on the screen of the display device, so as to display a so-called "SEM image" (secondary electron image), whereby any defect or the like of the pattern is observed. Besides, in the length measurement, the mask is linearly scanned about the designated position M so as to display a line profile on the screen. Here, the brilliance becomes higher at the right and left edges of a line to-be-measured. It is therefore possible to perform the known precise length measurement of the microscopic pattern with the SEM, for example, the measurement of the distance between the edges as the width of the line. In the length measurement, the length measuring operations are repeated a plurality of times for the designated position M of the pattern. On this occasion, the number of times of the length measuring operations and the measured values of the line width L are plotted as shown in FIG. 5B.

FIG. 5B shows an example of the plots of measurement results. In this figure, the axis of abscissas represents the number of times N of the length measuring operations, while the axis of ordinates represents the measured line width L. More specifically, the graph of FIG. 5B has been obtained by repeatedly measuring the line width L at the designated position M in FIG. 5A, and plotting the number of times N of the length measuring operations and the measured values of the line width L. With increase in the number of times N of the length measuring operations, the contamination of the mask 12 attributed to the electron beam irradiation appears, and the line width L enlarges gradually. Accordingly, letting L1 denote the first measurement value of the line width L and LN denote the Nth measurement value thereof, the difference ΔL=(LN−L1) in the repeated length measuring operations is calculated. When the calculated difference ΔL is not greater than a value corresponding to a precision experimentally obtained beforehand, it is decided that the contamination is less than a prescribed value, and that the length measurement values of the line width are correct. In contrast, when the calculated difference ΔL is greater than the value corresponding to the precision, the length measurement values are decided to be inaccurate and are disused, whereupon the mask 12 is irradiated with the ultraviolet rays as already described, thereby to remove the contamination of the surface of the mask 12. When the contamination removal by one time of ultraviolet irradiation is unsatisfactory, the ultraviolet irradiations are repeated a predetermined number of times.

FIGS. 6A and 6B are flow charts for explaining the other operations of the invention, respectively.

The flow chart of FIG. 6A shows an example in which, after the length measurement of the sample (mask) 12, this sample is irradiated with ultraviolet rays, thereby to remove or diminish the contamination. Here, steps S21 through S26 and S29 through S31 are respectively identical to the steps S1 through S6 and S8 through S10 in FIG. 2 already referred to, and they shall therefore be omitted from description.

Referring to FIG. 6A, a step S27 puts the mask (sample) 12 in the preparatory evacuation chamber 15. At this step, the mask (sample) 12 which has been irradiated with the electron beam and has had the length of its pattern measured is put in the preparatory evacuation chamber 15.

A step S28 irradiates the mask (sample) 12 with the ultraviolet rays. At this step, the mask (sample) 12 put in the preparatory evacuation chamber 15 at the step S27 has its whole surface irradiated with the ultraviolet rays for the predetermined time period by the ultraviolet irradiation unit 21 disposed in the preparatory evacuation chamber 15, thereby to remove the contamination. Subsequently, the mask (sample) 12 is conveyed into the SMIF pod 11 at the steps S29 through S31.

As thus far described, after the length measurement of the mask (sample) 12, this mask (sample) 12 is irradiated with the ultraviolet rays in the preparatory evacuation chamber 15, so as to remove or diminish the contamination ascribable to the electron beam irradiation during the length measurement, whereby the clean mask (sample) 12 can be delivered to the next step.

The flow chart of FIG. 6B shows an example in the case where the contamination is decided as being much when the difference ΔL obtained in the length measurement of the sample (mask) 12 is not smaller than the prescribed value ΔLs in FIG. 5B already referred to, where the mask (sample) 12 is returned into the preparatory evacuation chamber 15 and is irradiated with the ultraviolet rays so as to remove or diminish the contamination, and where the length measurement is repeated again. Here, steps S41, S42, S44, S46, S47, and S49 through S52 are respectively identical to the steps S1, S2, S4, S5, S6, and S7 through S10 in FIG. 2 already referred to, and they shall therefore be omitted from description.

Referring to FIG. 6B, a step S43 preliminarily evacuates the preparatory evacuation chamber 15. This step is performed as the preliminary evacuation of the preparatory evacuation chamber 15 from the atmospheric pressure at the first time. At the second time, et seq., the step S43 is performed on condition that the decision of a step S48 is "NO", in other words, that the difference ΔL in FIG. 5B as obtained by measuring the width of the pattern the plurality of times is not smaller than the prescribed value ΔLs, so the contamination is much. More specifically, at the second time, et seq., the mask (sample) 12 is conveyed into the preparatory evacuation chamber 15 at a step S53 (it is put out of the sample chamber 16), the preparatory evacuation chamber 15 is leaked at a step S54 so as to introduce the atmospheric air into this chamber 15, and the preparatory evacuation chamber 15 is preliminarily evacuated again at the step S43. Besides, as already stated, during the preliminary evacuation, the whole surface of the mask (sample) 12 is irradiated with the ultraviolet rays for the predetermined time period at the step S44, thereby to remove or diminish the contamination. The preparatory evacuation chamber 15 is regularly evacuated at a step S45, and the mask (sample) 12 is thereafter conveyed to the predetermined position of the sample chamber 16 at the step S46, whereupon the length measuring operations are repeated at the step S47. Here, at the steps S54 and S43, the preliminary evacuation is started after the preparatory evacuation chamber 15 has been leaked to establish the atmospheric pressure. However, the mere air (air containing oxygen, or oxygen) in the preparatory evacuation chamber 15 may well be leaked out in a small amount to the extent of satisfying the removal or diminution of the contamination based on the irradiation of the mask (sample) 12 with the ultraviolet rays (by way of example, the air or the like is leaked out to 1 Torr), whereby a time period for the preliminary evacuation is shortened. On the other hand, in a case where the decision of the step S48 is "YES" (in other words, where the difference ΔL is smaller than the prescribed value ΔLs in FIG. 5B), the results obtained by measuring the length of the pattern repeatedly the plurality of times are favorable, and the mask (sample) 12 is returned into the SMIF pod 11 at the steps S49 through S52 as already stated.

By the way, in the case where the contamination is removed or diminished by the ultraviolet irradiation inside the sample chamber 16, oxygen is introduced so as to locally blow this oxygen against the surface of the mask (sample) 12 from a nozzle, after the SEM observation (SEM length measurement) by way of example, and that region of the mask (sample) 12 which includes a place irradiated with the electron beam is irradiated with the ultraviolet rays by the ultraviolet irradiation unit 22, whereby the contamination is removed or diminished by active oxygen produced. The place irradiated with the electron beam is stored in a memory. In a case where there is no spatial room for mounting an excimer lamp which is the ultraviolet irradiation unit 22, a compact deuterium lamp is used so as to project the ultraviolet rays onto the region irradiated with the electron beam and having a diameter of several mm.

As described above, the invention pertains to charged particle beam apparatuses, especially length measurement apparatuses, which diminish the contaminations of samples, and it consists in a charged particle beam apparatus and a contamination removal method therefor, in which the contamination is diminished without etching, before or after the observation of the sample based on a charged particle beam, which enhance the reproduction precision of the length measurement of a pattern, and so forth, and which enhance an operability and a throughput in interlocking with the automatic conveyance of the sample.

What is claimed is:

1. A charged particle beam apparatus wherein an image is generated by irradiating a sample with a charged particle beam and detecting secondary charged particles emitted from the sample, comprising:
   a preparatory evacuation chamber into which the sample is conveyed, and which is preliminarily evacuated;
   an ultraviolet irradiation unit which is disposed in said preparatory evacuation chamber, and which irradiates a surface of the sample conveyed into said preparatory evacuation chamber, with ultraviolet rays for a predetermined time period; and
   a sample chamber into which the sample is conveyed from said preparatory evacuation chamber with a gate valve between said preparatory evacuation chamber and said sample chamber opened in the preliminarily evacuated state of said preparatory evacuation chamber in order to observe the image, and from which the sample is conveyed into said preparatory evacuation chamber after the image observation;
   wherein the ultraviolet irradiation of the sample in said preparatory evacuation chamber by said ultraviolet irradiation unit is performed before the conveyance of the sample into said sample chamber, or/and after the conveyance thereof from said sample chamber, thereby to remove contamination on the surface of the sample.

2. A charged particle beam apparatus wherein an image is generated by irradiating a sample with a charged particle beam and detecting secondary charged particles emitted from the sample, comprising:
   a preparatory evacuation chamber into which the sample is conveyed, and which is preliminarily evacuated;
   an intermediate chamber into which the sample is conveyed before or/and after the conveyance of the sample into said preparatory evacuation chamber;
   an ultraviolet irradiation unit which is disposed in said intermediate chamber, and which irradiates a surface of the sample conveyed into said intermediate chamber, with ultraviolet rays for a predetermined time period; and
   a sample chamber into which the sample is conveyed from said preparatory evacuation chamber with a gate valve between said preparatory evacuation chamber and said sample chamber opened in the preliminarily evacuated state of said preparatory evacuation chamber in order to observe the image, and from which the sample is conveyed into said preparatory evacuation chamber after the image observation;
   wherein the ultraviolet irradiation of the sample in said intermediate chamber by said ultraviolet irradiation unit is performed before the conveyance of the sample into said preparatory evacuation chamber, or/and after the conveyance thereof from said preparatory evacuation chamber, thereby to remove contamination on the surface of the sample.

3. A contamination removal method for a charged particle beam apparatus wherein an image is generated by irradiating a sample with a charged particle beam and detecting secondary charged particles emitted from the sample, comprising:
   a first step of conveying the sample into a preparatory evacuation chamber, and preliminarily evacuating the preparatory evacuation chamber;
   a second step of conveying the sample into a sample chamber in the preliminarily evacuated state of the preparatory evacuation chamber in order to observe the image, and then conveying the sample from the sample chamber into the preparatory evacuation chamber after the image observation; and
   a third step of irradiating a surface of the sample conveyed into the preparatory evacuation chamber, with ultraviolet rays for a predetermined time period by an ultraviolet irradiation unit which is disposed in the preparatory evacuation chamber;
   said third step being performed before the conveyance of the sample into the sample chamber, or/and after the conveyance thereof from the sample chamber, thereby to remove contamination on the surface of the sample.

4. A contamination removal method for a charged particle beam apparatus wherein an image is generated by irradiating a sample with a charged particle beam and detecting secondary charged particles emitted from the sample, comprising:
   a first step of conveying the sample into the preparatory evacuation chamber, and preliminarily evacuating the preparatory evacuation chamber;
   a second step of conveying the sample into an intermediate chamber before or/and after the conveyance of the sample into the preparatory evacuation chamber;
   a third step of conveying the sample into a sample chamber in the preliminarily evacuated state of the preparatory evacuation chamber in order to observe the image, and then conveying the sample from the sample chamber into the preparatory evacuation chamber after the image observation; and
   a fourth step of irradiating a surface of the sample conveyed into the intermediate chamber, with ultraviolet rays for a predetermined time period by an ultraviolet irradiation unit which is disposed in the intermediate chamber;
   said fourth step being performed before the conveyance of the sample into the preparatory evacuation chamber, or/and after the conveyance thereof from the preparatory evacuation chamber, thereby to remove contamination on the surface of the sample.

5. A charged particle beam apparatus as defined in claim 1, wherein the ultraviolet irradiation of the sample in at least one of said preparatory evacuation chamber and said intermediate chamber by said ultraviolet irradiation unit is performed by introducing either of oxygen and ozone into the corresponding chamber.

6. A charged particle beam apparatus as defined in claim 5, wherein the ultraviolet irradiation of the sample in at least one of said preparatory evacuation chamber and said intermediate chamber by said ultraviolet irradiation unit is performed under either of a reduced internal pressure and a raised internal pressure of the corresponding chamber.

7. A charged particle beam apparatus as defined in claim 6, wherein the ultraviolet irradiation of the sample by said ultraviolet irradiation unit is performed in interlocking with the conveyance of the sample.

8. A charged particle beam apparatus as defined in claim 7, wherein a whole area of the surface of the sample is irradiated with the ultraviolet rays.

9. A charged particle beam apparatus as defined in claim 8, wherein said ultraviolet irradiation unit includes an excimer lamp.

10. A charged particle beam apparatus as defined in claim 2, wherein the ultraviolet irradiation of the sample in at least one of said preparatory evacuation chamber and said intermediate chamber by said ultraviolet irradiation unit is performed by introducing either of oxygen and ozone into the corresponding chamber.

11. A charged particle beam apparatus as defined in claim 10, wherein the ultraviolet irradiation of the sample in at least one of said preparatory evacuation chamber and said intermediate chamber by said ultraviolet irradiation unit is performed under either of a reduced internal pressure and a raised internal pressure of the corresponding chamber.

12. A charged particle beam apparatus as defined in claim 11, wherein the ultraviolet irradiation of the sample by said ultraviolet irradiation unit is performed in interlocking with the conveyance of the sample.

13. A charged particle beam apparatus as defined in claim 12, wherein a whole area of the surface of the sample is irradiated with the ultraviolet rays.

14. A charged particle beam apparatus as defined in claim 13, wherein said ultraviolet irradiation unit includes an excimer lamp.

* * * * *